United States Patent [19]

Takeuchi

[11] 4,096,026
[45] Jun. 20, 1978

[54] METHOD OF MANUFACTURING A CHROMIUM OXIDE FILM

[75] Inventor: Susumu Takeuchi, Tokyo, Japan

[73] Assignee: Toppan Printing Co., Ltd., Tokyo, Japan

[21] Appl. No.: 709,181

[22] Filed: Jul. 27, 1976

[51] Int. Cl.² .................... C23C 15/00; C23C 11/08
[52] U.S. Cl. .................... 156/656; 156/655; 156/667; 204/192 D; 204/192 C; 204/192 P; 204/192 N; 204/192 SP; 427/248 C; 427/248 R
[58] Field of Search .............. 427/248 R, 248 C, 124; 204/192 P, 192 SP, 192 C, 192 N; 156/656, 655, 667

[56] References Cited

U.S. PATENT DOCUMENTS

| 3,650,921 | 3/1972 | Peters | 204/192 P |
|---|---|---|---|
| 3,669,863 | 6/1972 | Peters | 204/192 P |
| 3,681,227 | 8/1972 | Szupillo | 204/192 P |
| 3,715,244 | 2/1973 | Szupillo | 204/192 P |
| 3,873,341 | 3/1975 | Janus | 204/192 D |

FOREIGN PATENT DOCUMENTS

| 684,673 | 4/1964 | Canada | 427/248 C |
| 775,002 | 5/1957 | United Kingdom | 427/248 C |
| 895,879 | 5/1962 | United Kingdom | 264/192 P |
| 966,161 | 8/1964 | United Kingdom | 427/248 C |
| 1,117,009 | 6/1968 | United Kingdom | 204/192 SP |

OTHER PUBLICATIONS

Sinclair et al., "Materials for Use in a Durable Selectively Semitransparent Photomask," J. Electrochem Society, Feb. 1971, pp. 341–344.
Bratto et al., IBM Tech. Dir. Bull., *High–Temperature . . . Process*, vol. 15, No. 2 (7–1972), p. 685.

*Primary Examiner*—John T. Goolkasian
*Attorney, Agent, or Firm*—Bacon & Thomas

[57] ABSTRACT

A method of manufacturing a chromium oxide film which comprises the steps of scattering particles of chromium metal by means of, for example, sputtering in an atmosphere selected from the group consisting of $CO_2$ gas, CO gas, a mixture of $CO_2$ gas and CO gas, a mixture of $CO_2$ gas and inert gas, a mixture of CO gas and inert gas and a mixture of $CO_2$ gas, CO gas and inert gas; oxidizing the scattered particles of chromium metal with the atmosphere; and depositing the resultant chromium oxide film on a substrate.

12 Claims, 8 Drawing Figures

METHOD OF MANUFACTURING A CHROMIUM OXIDE FILM

BACKGROUND OF THE INVENTION

This invention relates to a method of manufacturing a chromium oxide film adapted for use as, for example, a photomask.

Where an electronic circuit is integrated with high precision, a photomask is used selectively to project light on a photoresist deposited on a properly worked surface of a substrate. The photowork is prepared by applying, for example, photoetching to a photomask blank consisting of a light-permeable substrate made of, for example, glass, one side of which is coated with an opaque film. A chromium oxide film has been known to be superior in mechanical strength and chemical resistivities as compared with iron oxide film and used as an opaque material for a photomask.

A known process of manufacturing a chromium oxide film comprises the step of evaporating $Cr_2O_3$ evaporation source or $Cr_2O_3$ target on a substrate in vacuum or by sputtering or ion plating. With this process, however, a source material of evaporation originally consists of a particular form of chormium oxide ($Cr_2O_3$) and does not admit of any further control of the degree of oxidation of this compound to a suitable level for providing, in high reproducibility, an opaque film having desired optical properties and mechanical strength. An opaque film produced according to the prior art is also subject to various defects such as projects or pinholes. Another known process of manufacturing a chromium oxide film which has been proposed to eliminate the above-mentioned drawbacks comprises the steps of providing a source material of evaporation consisting of chromium metal alone; evaporating the chromium metal in an atmosphere containing $O_2$ gas; and controlling the composition of chromium oxide according to the manner in which the chromium metal is reacted with $O_2$ gas. Where said another known process is carried out by vacuum evaporation, then a filament used as a heat source is prominently deteriorated due to oxidation by said $O_2$ gas and undesirably decreases in effective life. This event also occurs in the plasma sputtering process. Further where $O_2$ gas has a high concentration in carrying out other forms of sputtering such as diode sputtering, radio frequency sputtering and ion plating, then difficulties arise in attaining a stable electric discharge or ion bombardment. Still another known chemical process of depositing chromium oxide in the gaseous phase (chemical vapor deposition) requires a substrate to be heated to 500° to 600° C, and is little adpated for practical application due to the substrate being deformed by such high temperature.

SUMMARY OF THE INVENTION

This invention has been accomplished in view of the above-mentioned circumstances and is intended to provide a method of manufacturing a chromium oxide film having the later described advantages such as a substantial absence of pinholes, low reflectance and prominent readiness for etching. Namely, a chromium oxide film-manufacturing method according to this invention characteristically comprises the steps of scattering particles of chromium metal in an atmosphere selected from the group consisting of $CO_2$ gas, Co gas, a mixture of $CO_2$ gas and CO gas, a mixture of $CO_2$ gas and inert gas, a mixture of CO gas and inert gas and a mixture of $CO_2$ gas, CO gas and inert gas; oxidizing scattered particles of chromium metal; and depositing the resultant chromium oxide film on a substrate.

DETAILED DESCRIPTION OF THE PREFERRED EMBODIMENTS

Figure 1:
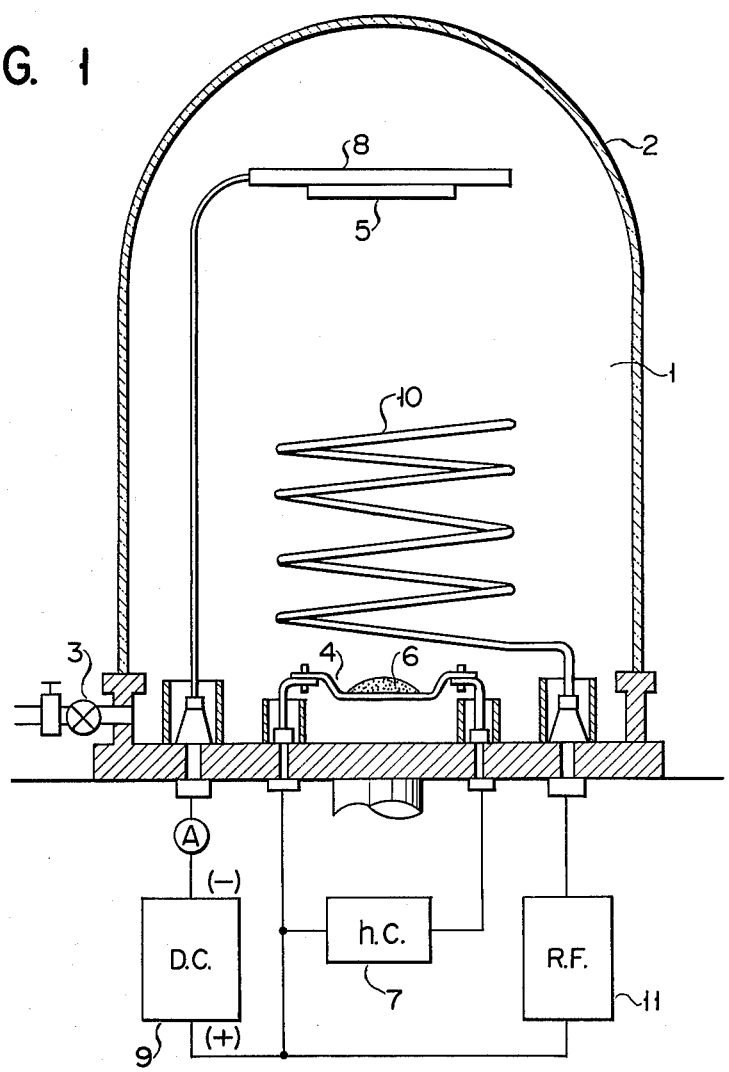
FIG. 1 is a schematic illustration of an apparatus for forming a chromium oxide film by radio frequency ion plating according to this invention.

A chromium oxide film-manufacturing method according to this invention admits of application of the known processes, for example, vacuum evaporation, various forms of sputtering such as plasma sputtering, radio frequency diode sputtering, D.C. diode sputtering, and radio frequency triode sputtering, and ion plating.

With this invention, an atmosphere for oxidizing chromium metal is formed of $CO_2$ gas or CO gas alone, a mixture of $CO_2$ gas and CO gas or a mixture of $CO_2$ gas, CO gas and inert gas such as argon, helium or xenon. As later described, the more concentrated an oxidizing gas such as $CO_2$ gas or CO gas, the more oxidized chromium metal and the more decreased the film-forming rate. Therefore, the concentration of an oxidizing gas applied is suitably chosen by those skilled in the art depending on the properties demanded of a chromium oxide film used.

There will now be described for illustration the case where a chromium oxide film is manufactured by sputtering in an oxidizing atmosphere consisting of a mixture of $CO_2$ gas and Ar gas. A chromium oxide film can be formed over a broad range of $CO_2$ gas concentration as 5 to 100%. A $CO_2$ gas concentration of 5 to 35% is preferred particularly for the making of a photomask blank. Where $CO_2$ gas has a lower concentration than 5%, chromium metal is insufficiently oxidized. Conversely, where $CO_2$ gas has a higher concentration than 35%, then a chrominum oxide film is formed too slowly for practical purpose. Where $CO_2$ gas has a concentration ranging from 5 to 15%, then chromium metal is oxidized in a small degree, providing a electro-conductive black chromium oxide film indicating a constant low reflectivity over the whole range of light waves. Such black chromium oxide film presents a high optical density even when the film is thin and a low reflectivity with respect to a continuous spectral light such as that emitted from tungsten and is favorably accepted where alighnment between a photomask and wafer is carried out by an autoaligner. Where $CO_2$ gas has a concentration ranging between 15 and 35%, then chromium metal is oxidized in a relatively large degree, providing, as it is deposited on a metal chromium film, a yellow chromium oxide film (300A in thickness) presenting a minimum reflectivity with respect to those of the light waves emitted from a mercury lamp which range from the H to the G line (405 to 436 nm).

Such chromium oxide film has a low reflectivity with respect to a light-sensitive zone (350 to 450 nm) of a photoresist and, when used as a photomask, is well adapted to form a precisely defined photoresist pattern on, for example, a semiconductor wafer.

There will now be described the case where a chromium oxide film is manufactured by radio frequency ion plating according to the method of this invention. The ion plating process is carried out as follows. A vacuum chamber is filled with one or more kinds of reactive gas. Pressure in the vacuum chamber is reduced to a lower level than about $10^{-3}$ Torr units. High frequency voltage is impressed on the poximity of an evaporation source consisting of, for example, chromium metal. The gas filled in the vacuum chamber is subjected to an electric discharge for ionization. Part or the whole of the particles of chromium metal scattered from the evaporation source by, for example, resistance heating or electron beam heating is excited and ionized or simultaneously reacted for oxidization by the ionized region of the above-mentioned introduced gas. D.C. voltage is impressed between the evaporation source and a transparent substrate quickly to deposit the scattered particles of chromium oxide on said substrate.

There will now be described the ion plating apparatus of this invention schematically shown in FIG. 1. A vacuum chamber 1 defined within a bell jar 2 can be easily evacuated to a level of about $10^{-5}$ Torr units by an evacuating means (not shown). The vacuum chamber 1 is filled through a variable leak valve 3 with various gases such as inert gas and reactive gas. A material 6 being evaporated on a transparent substrate 5 is placed in an evaporation source tray 4 heated by, for example, resistance or electron beams and so disposed as to face said substrate 5. With the embodiment of FIG. 1, the evaporation source tray 4 is of the resistance heating type and connected to a resistance heating power source 7. The evaporation source tray 4 is further connected to an acceleration D.C. power source 9 so as to be maintained at a positive potential relative to the negative potential of a substrate holder 8 concurrently acting as a cathode. A high frequency electrode 10 of metal coil is provided above the evaporation source tray 4. The high frequency electrode 10 is connected to a high frequency generator 11 producing, for example, as high a frequency as 13.56 MHz to be impressed with said high frequency voltage. The above mentioned high frequency ion plating process has the following advantages:

(1) Evaporation accompanied with reaction can be carried out at a relatively low level of vacuum of the order of, for example, $10^{-4}$ Torr units;

(2) Since said evaporation does not considerably raise substrate temperature, even a synthetic resin substrate allows said evaporation to be effected without difficulties and (3) A chromium oxide film evaporated on a substrate has a great bonding strength.

Where a chromium oxide film is formed by vacuum evaporation according to the method of this invention, a reactive atmosphere is formed of $CO_2$ gas, CO gas, or a mixture of $CO_2$ gas and CO gas. It is practically unnecessary to include inert gas, for example, argon in a reactive atmosphere.

Figure 2:
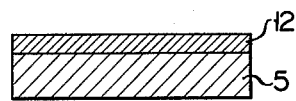
FIGS. 2 to 5 are cross sectional views of different photomasks, showing various concrete forms of chromium oxide film prepared by the method of this invention.
Figure 3:
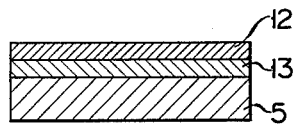
Figure 4:
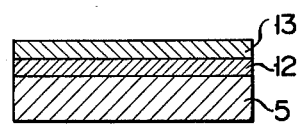
Figure 5:
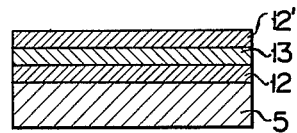

According to the method of this invention, a chromium oxide film is produced in four forms shown in FIGS. 2 to 5. The form of FIG. 2 in which a chromium oxide film 12 is deposited on a glass substrate 5 is used as a photomask such as a seethrough mask permeable to visible lights or a mask for exposure to all light waves. The form of FIG. 3 is prepared by previously mounting a layer 13 of chromium metal on the glass substrate 5 and coating a chromium oxide film 12 on said chromium metal layer 13. The form of FIG. 3 is useful as a low reflection type photomask presenting a low reflectivity with respect to light waves (350 to 450 nm) projected thereon. The form of FIG. 4 is obtained by depositing a chromium oxide film 12 on the glass substrate 5, and coating the chromium metal layer 13 on said chromium oxide film 12. The form of FIG. 4 enables the surface of the glass substrate 5 to indicate a low reflectivity with respect to light waves projected thereon and is preferred in that alignment between a photomask prepared from the chromium oxide film of FIG. 4 and a photoresist can be effected with high precision by means of an autoaligner. Further, the chromium oxide film 12 is generally desired to present a constantly low reflectivity with respect to all light waves. The form of FIG. 5 is prepared by mounting another chromium oxide film 12' on the chromium metal layer 13 of FIG. 4. In this case, both sides of the substrate 5 indicate a low reflectivity with respect to light waves projected thereon. The chromium oxide film is desired to have thickness of about 300A when laminated with the chromium metal layer 13 and a thickness equal to or larger than 1000 to 2000 A when used singly as shown in FIG. 2.

The substrate 5 may consist of transparent glass having a low expansion coefficient such as soda lime glass, boro-silicate glass, aluminosilicate glass, alumino-boro-silicate glass, quartz glass and other transparent materials such as X-ray-permeable synthetic resin (for example, polyester resin manufactured by the Du Pont Company under the trade mark "Mylar").

A chromium oxide film prepared by the method of this invention has the following advantages:

(1) A chromium oxide film produced is substantially free from pinholes, enabling a zero defect blank to be manufactured with high yield;

(2) The pattern precision of a photomask is determined by its own power of resolving light waves to which the photomask is exposed as well as by the resolving power of a photoresist itself. A photomask prepared from a chromium oxide film produced in an oxidizing atmosphere according to the prior art had a pattern reproducibility of 1 to 2$\mu$m. In contrast, a photomask prepared from a chromium oxide film produced by the method of this invention and subjected to etching under the same conditions as in the prior art (except for the composition of an atmosphere in which reaction takes place for the making of a chromium oxide film) has a high pattern precision as less than 1$\mu$m.

Figure 6:
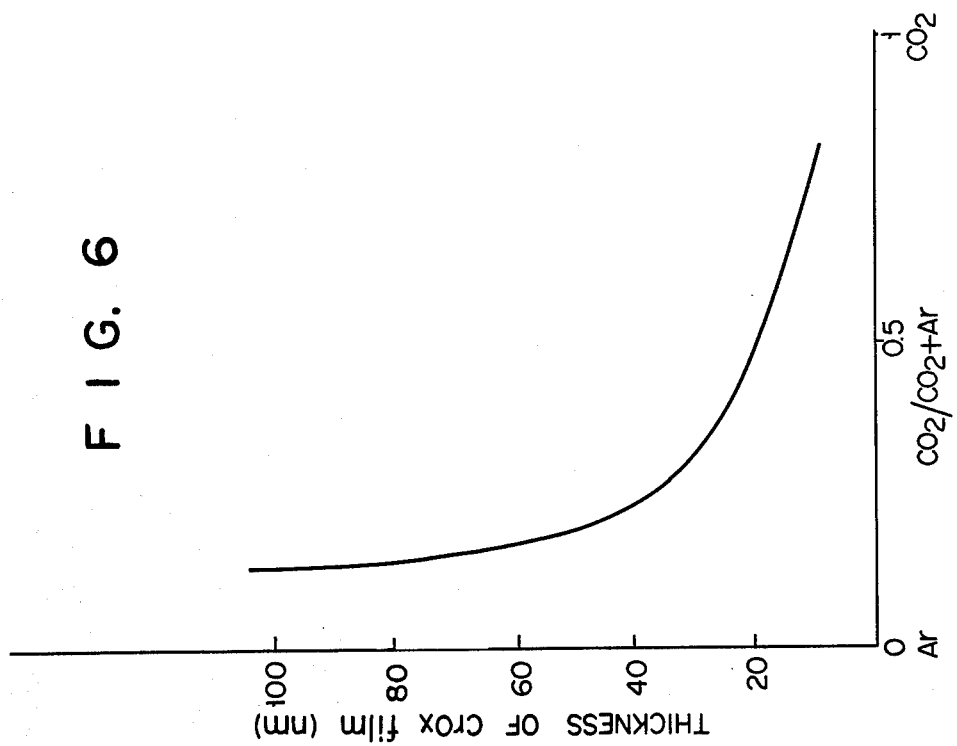
FIG. 6 is a curve diagram indicating the relationship of $CO_2$ gas concentration and CrOx film thickness.

(3) A photomask prepared from a chromium oxide produced by the method of this invention can be etched more quickly than a photomask formed of a chromium oxide obtained by reaction in an atmosphere of an $O_2$—Ar system and moreover has a greater readiness for etching. Therefore, the photomask according to this invention has finely defined pattern;

(4) With this invention, the reactive atmosphere does not contain $O_2$ gas as in the prior art, but is formed of $CO_2$ or CO gas. Therefore, a filament used as heating source is hardly damaged, whether a chromium oxide film is deposited on a substrate by sputtering, vacuum evaporation or ion plating, and moreover is little worn out;

(5) The method of this invention enables a chromium oxide film to be grown faster than in the prior art. Where, in case of plasma sputtering, comparison is made on the basis of the same thickness between a length of time required to produce a chromium oxide film in an oxidizing atmosphere consisting of 20% $O_2$ and 80% Ar according to the prior art and a length of time required to obtain a chromium oxide film in an oxidizing atmosphere consisting of 20% $CO_2$ and 80% Ar according to this invention, it is proved that the formation of a chromium oxide film in the latter atmosphere takes only one-fifth of the time consumed in the case of the former atmosphere. The rate at which a chromium oxide film is formed according to the method of this invention is also affected by a percentage of Ar relative to that of $CO_2$ or CO gas. Namely, the higher the percentage of Ar, the faster the formation of a chromium oxide film. FIG. 6 is a curve diagram showing the relationship of a thickness of a chromium oxide film formed and the ratio of $CO_2/Ar+CO_2$ as measured on the basis of the same sputtering time when an oxidizing atmosphere was formed of $CO_2$ and Ar. The percentage of $CO_2$ is plotted on the abscissa and a thickness (nm) of CrOx on the ordinate. The curve diagram of FIG. 6 was obtained when the revolution speed of a substrate was chosen to be 12 r.p.m., a chromium oxide film was formed in 14 minutes and pressure in the chamber was set at $1.2\times10^{-3}$ Torr units.

Figure 8:
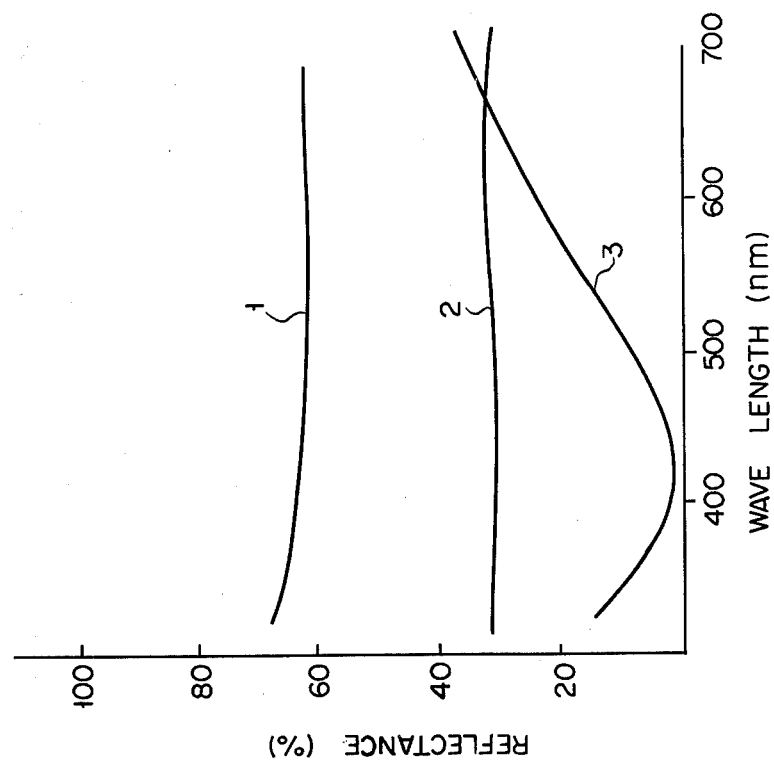
FIG. 8 is a curve diagram showing the relationship of light wave lengths and reflectivities of various photomasks.
Figure 7:
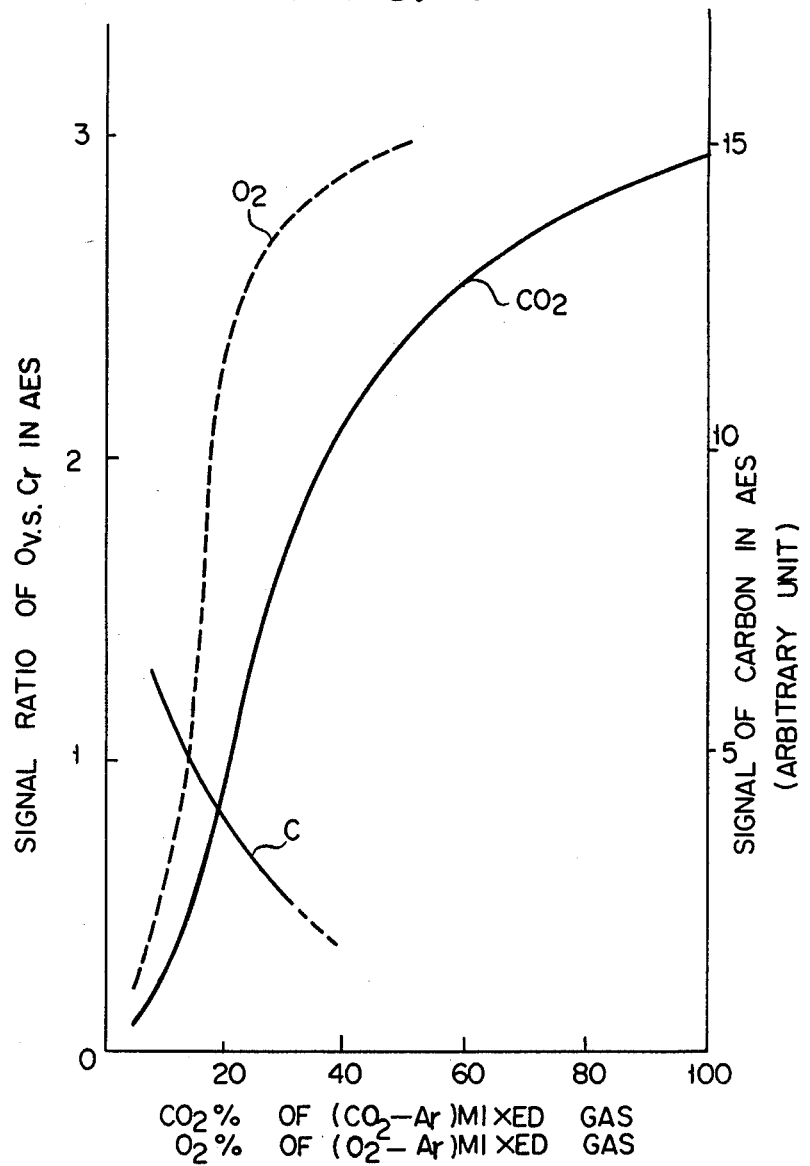
FIG. 7 is a curve diagram showing the relationship of a concentration of oxidizing gas and a degree of oxidation of chromium metal.

(6) The method of this invention enables the degree of oxidation of a chromium oxide film to be easily controlled, offering chromium oxide films having various properties. FIG. 7 is a curve diagram, in which a percentage of $CO_2$ gas based on a mixture of $CO_2$ gas and Ar gas and a percentage of $O_2$ gas based on a mixture of $O_2$ gas and Ar gas are plotted on the abscissa, the degree of oxidation of a chromium oxide film formed is shown on the left ordinate, and a carbon content in the chromium oxide film is presented on the right ordinate. Numerals of 1, 2, and 3 on the left ordinate do not denote values of $x$ in CrOx, but indicate signal ratios of OV.S.Cr as measured by the Auger Electron Spectroscopy analysis. It is seen from FIG. 7 that in an oxidizing atmosphere consisting of $O_2$ gas and Ar gas, oxidation of chromium metal proceeds rapidly, as shown in a broken line, due to a great oxidizing power of $O_2$ gas even when the oxidizing atmosphere contains a very small amount of $O_2$ gas, presenting difficulties in controlling a degree of oxidation of a chromium oxide film being produced and also in attaining the reproducibility of the degree of oxidation. In contrast, an oxidizing atmosphere consisting of $CO_2$ gas and Ar gas according to this invention allows oxidation of chromium metal to proceed slowly, as shown in a solid line, enabling a chromium oxide film having a desired degree of oxidation to be reproduced by varying a percentage of $CO_2$ gas. Further, in the oxidizing atmosphere consisting of $CO_2$ gas and Ar gas, a carbon content of a chromium oxide film produced more decreased, as shown in a curve C, as the atmosphere contained a larger amount of $CO_2$ gas;

(7) The method of this invention can provide a chromium oxide film of low reflectivity. Where a chromium oxide film of high reflectivity is used as a photomask, then a light projected on a photoresist formed on a semiconductor wafer is reflected from the surface of said chromium oxide film to spread a photoresist pattern beyond a desired range, causing the photoresist to be exposed to an unnecessarily large amount of light. This event reduces a desired precision of a photoresist pattern, presenting difficulties in providing a finely defined photoresist pattern on the semiconductor wafer. For this reason, a chromium oxide film is preferred to be of as low reflectivity as possible. FIG. 8 shows the relationship of light waves and the reflectivity of a chromium metal layer (curve 1), the reflectivity of a chromium oxide film (curve 2) produced in an oxidizing atmosphere consisting of 10% $CO_2$ and 90% Ar gas and the reflectivity of a chromium oxide film (curve 3) deposited on a chromium metal layer in an oxidizing atmosphere consisting of 20% $CO_2$ gas and 80% Ar gas. A chromium oxide film produced in an oxidizing atmosphere consisting of 20% $CO_2$ gas and 80% Ar gas according to this invention shows an extremely low reflectivity with respect to near ultra-violet rays. Therefore, this chromium oxide film is opaque to visible light waves and is well adapted to be used as a photomask of low reflectivity with respect to light waves (350 to 450 nm). Further, the extremely small thickness of a chromium oxide film produced by the method of this invention has the advantage of improving the precision of a photoresist pattern.

This invention will be more fully understood by reference to the examples which follow.

EXAMPLE 1

The vacuum chamber of a plasma sputtering device was charged with a mixture of $CO_2$ gas and Ar gas, until pressure in the vacuum chamber reached a level of $1.2\times10^{-3}$ Torr units. Particles of chromium metal were scattered from a target of chromium metal with filament current set at 45 Amp., anode current at 8 Amp. and target voltage at 900 volts. A chromium oxide film was formed on a soda lime glass substrate (measuring $4\times4$ inches) disposed to face the chromium metal target. This substrate was revolved at a speed of 12 r.p.m. Two kinds of chromium oxide film were prepared in an atmosphere of 10% $CO_2$ gas and 90% Ar gas and that of 20% $CO_2$ gas and 80% Ar gas respectively. Comparison was made between the properties of said two kinds of chromium oxide film, the results being presented in the following Table 1.

Table 1

| | Properties of chromium oxide film | |
|---|---|---|
| Atmosphere | 10% $CO_2$ and 90% Ar | 20% $CO_2$ and 80% Ar |
| Film thickness | 1100A | 2000A |
| Light permeability | 0.4% in case of $\lambda$: 400 nm  1.1% in case of $\lambda$: 550 nm | 0.1% in case of $\lambda$: 400 nm  12% in case of $\lambda$: 550 nm |
| Conductivity | Present | Absent |
| Color | Black | Brown |
| Light reflectivity | About 33% over the range from the waves of near ultra-violet rays to those of all visible light rays | About 25% with respect to light waves of 350 to 450 nm |
| Time required for formation of a film | 24 minutes | 35 minutes |
| Applications | Seethrough mask  Adaptability for an autoaligner is good | Blank for a seethrough mask |

Where, in this example, the concentration of $CO_2$ gas was increased to 100%, a stable electric discharge was still carried out. Depletion of a filament was externally little observed. Where a chromium oxide film produced in this example was applied in the ordinary photofabrication process, a photomask pattern having as fine a width as 1 micron was formed more easily than in the case of the prior art chromium mask blank of high reflectivity. A photoresist mounted on a semiconductor wafer was selectively exposed to light, using a photomask prepared from the chromium oxide film of this invention. The photoresist was substantially saved from dimensional changes of a pattern resulting from the high reflectivity of the prior art chromium photomask. The chromium oxide film of this invention had a mechanical strength equal to or higher than the prior art chromium film. Pinholes appeared on the present chromium oxide film in a smaller size than 1 micron and in a numer of zero to 1 per square centimeters. Accordingly, the chromium oxide film of this invention enabled a zero defect photomask blank to be produced with high yield, and also was proved to have good mechanical strength, adhesivity and resistance to chemicals.

EXAMPLE 2

A chromium metal layer 500A thick was formed on a 4-inch square soda lime glass substrate by sputtering chromium metal from a target of chromium metal in an ordinary argon gas atmosphere. The glass plate thus coated was used as a substrate. After evacuated, the sputtering chamber was charged with an oxidizing atmosphere consisting of 20% $CO_2$ gas and 80% Ar gas, until pressure in the chamber reached a level of $1.5 \times 10^{-3}$ Torr units. A chromium oxide film 300A thick was deposited on the chromium metal layer by plasma sputtering under the same conditions as in Example 1. In this case, the substrate was revolved at the rate of 12 r.p.m. and a chromium oxide film was formed in 6 minutes. The surface of the chromium oxide film produce indicated as low a reflectivity as less than 5% with respect to light waves (350 to 450 nm) to which a photoresist was sensitized proving that the chromium oxide film was well adapted for use as a photomask blank.

When dipped in an alkaline etching solution of potassium permanganate, the chromium metal layer and chromium oxide film were dissolved in about 8 minutes. When immersed in the same etching solution, a chromium metal layer and a chromium oxide film prepared by way of comparison in an oxidizing atmosphere of 20% $O_2$ gas and 80% Ar gas took a longer time than 30 minutes to be dissolved. In contrast, where a photoresist pattern was formed on a photomask prepared from the chromium oxide film of this invention, a photoresist pattern having a width of 1 micron was readily reproduced. A photomask prepared from a chromium oxide film produced in an oxidizing atmosphere containing 20% $O_2$ gas according to the prior art took a long etching time, causing those portions of a photoresist pattern which had a smaller width than 3 microns to disappear during etching and moreover rendering the photoresist pattern itself deformed. When determined by the Auger Electron Spectroscopy analysis, a chromium oxide film prepared by the method of this invention was proved to have a lower degree of oxidation than the prior art chromium oxide film produced in an oxidizing atmosphere containing $O_2$ gas and moreover be free from carbon. These difference between the properties of the chromium oxide films of this invention and prior art are assumed to contribute to the improved etching property of the chromium oxide film of the invention.

Determination was made of the scratch resistance of a chromium oxide film obtained in Example 2 by the Clemens type scratching strength tester, showing that said chromium oxide film had a scratch resistance equal to or greater than the prior art chromium photomask. To examine the adherence of the present chromium oxide film to a substrate, there was formed a chromium oxide film pattern having as fine a width as 0.8 micron. When washed by supersonic waves, the pattern did not fall off. When put to a peeling test using an adhesive tape, the pattern did not come off either.

EXAMPLE 3

A plasma sputtering chamber was filled with a reactive atmosphere consisting of 10% $CO_2$ gas and 90% Ar gas, until pressure in the device reached $1.5 \times 10^{-3}$ Torr units. Particles of chromium metal were sputtered from a target of chromium metal on a 4-inch square soda lime glass substrate revolving at the rate of 12 r.p.m. to form a chromium oxide film 300A thick. The film was formed in 4 minutes, had a blackish color and presented a constantly low reflectivity over the range of from the waves of near ultra-violet rays to those of visible light rays.

Air was drawn off again from the sputtering apparatus to a high level of vacuum. A chromium metal layer 600A thick was deposited on the above-mentioned chromium oxide layer by the ordinary argon sputtering process, thereby providing a photomask blank. The blank was formed into a photomask, which a low reflectivity on the side facing the glass substrate and easy alignment by an autoaligner without raising any problem with precision. In Example 3, the same result was obtained even when the $CO_2$ gas content was changed from 10% to 20%.

EXAMPLE 4

The vacuum chamber of a plasma sputtering chamber was filled with an reactive atmosphere consisting of 10% $CO_2$ gas and 90% Ar gas, until pressure in vacuum chamber reached a level of $1.2 \times 10^{-3}$ Torr units. Plasma sputtering was carried out with filament current set at 45 Amp., anode current at 8 Amp. and target voltage at 900 volts. Particles of chromium metal were scattered from a target of chromium metal to form a chromium oxide film 300A thick on a soda lime glass substrate facing said target. Thereafter a chromium metal layer 500A thick was deposited on the chromium oxide film by argon sputtering. Further, a chromium oxide film 300A thick was mounted on the chromium metal layer 500A thick in a reactive atmosphere consisting of 20% $CO_2$ gas and 80% Ar gas. Thus, there was provided a triple layer photomask blank. The surface of this blank presented a low reflectivity of about 5% with respect to light waves to which the resultant photoresist was exposed. The backside of the blank also indicated a low reflecting with respect to all light waves. Therefore, the blank was found to be of excellent quality free from pinholes.

EXAMPLE 5

A bipolar ratio frequency diode sputtering device was filled with argon gas, until pressure in the device reached $1 \times 10^{-2}$ Torr units. Particles of chorimum metal scattered from a target of chromium metal with an output of 200W to form a chromium metal layer 500A thick on a 4-inch square glass substrate. The chromium metal layer was formed in 3.5 minutes. Thereafter, the sputtering device was filled with a reactive atmosphere consisting of 20% $CO_2$ gas and 80% Ar gas, until pressure in the sputtering device reached $1\times10^2$ Torr units. A chromium oxide film was deposited on the chromium metal layer 500A thick with an output of 200W. The chromium oxide film was formed in 5 minutes. A photomask blank thus prepared had the same quality as in Example 2 and was proved to be of excellent quality.

The same kind of a chromium oxide film as described above was obtained even when the 20% $CO_2$ gas was replaced by 20% CO gas or a mixture of 10% $CO_2$ gas and 10% CO gas.

EXAMPLE 6

A substrate prepared by depositing a chromium metal layer 500A thick on a 4-inch square soda lime glass plate was supported by a holder. A vacuum bell jar was filled with an oxidizing atmosphere consisting of 100% $CO_2$ gas until pressure in the bell jar reached a level of $1\times10^{-4}$ Torr units. Particles of chromium metal were scattered from a source tray of evaporation operated by resistance heat to deposit a chromium oxide film 300A thick on the chromium metal layer already formed on the above-mentioned glass substrate. The chromium oxide film was formed in 2 minutes. The chromium oxide film mounted on the surface of a photomask blank thus prepared indicated a very low effectivity of about 10% with respect to light waves to which the resultant photoresist was exposed. In this case, the filament of a vacuum evaporation device was not noticeably worn out.

EXAMPLE 7

After evacuated to a lower level than $5\times10^{-6}$ Torr units, a bell jar was filled with an oxidizing atmosphere consisting of $CO_2$ gas and Ar gas mixed in the ratio of 1:1, metal pressure in the bell jar reached a level of $8\times10^4$ Torr units. A helical high frequency electrode producing high frequency voltage of 3.0 KV at a frequency of 13.56 MHz was set near a source, of evaporation. D.C. acceleration voltage of 500 volts was impressed between the source of evaporation and a transparent glass substrate to carry out ion bombardment on the surface of the transparent glass substrate for 5 minutes to clean said surface. Thereafter chromium metal was evaporated from the source of evaporation by resistance heat, while both high frequency voltage and D.C. acceleration voltage were impressed on the source of evaporation, thereby forming an opaque chromium oxide film about 2200A thick on the glass substrate. The opaque chromium oxide film constituting a photomask blank presented a light permeability of 0.5% and a reflectivity of 29% with respect to light waves of 350 to 450 nm, and was proved to have a good optical property. The blank had a great bonding strength contained very few pinholes. Further, the blank was etched at the proper rate of 20A/sec. by an ordinary etching solution of cerium nitrate series used with chromium metal and chromium oxide, providing a good photoresist pattern.

What is claimed is:

1. A method of manufacturing a chromium oxide film which comprises the steps of scattering particles of chromium metal in an atmosphere selected from the group consisting of a mixture of $CO_2$ gas and inert gas, a mixture of CO gas and inert gas and a mixture of $CO_2$ gas, CO gas and inert gas, the inert gas content being 65 to 95% by volume based on the whole gas mixture, oxidizing scattered particles of chromium metal in the gaseous atmosphere and depositing the oxidized particles of chromium metal on a substrate.

2. The method of manufacturing a chromium oxide film according to claim 1, wherein the substrate is a transparent plate.

3. The method of manufacturing a chromium oxide film according to claim 1, wherein the substrate is previously coated with a chromium metal layer, and a chromium oxide film is formed on the chromium metal layer.

4. The method of manufacturing a chromium oxide film according to claim 3, wherein the chromium oxide film is produced in an atmosphere consisting of a mixture of 15 to 35% of $CO_2$ gas and 85 to 65% of inert gas, and indicates a minimum reflectivity with respect to light waves of 350 to 450 nm.

5. The method of manufacturing a chromium oxide film according to claim 1, wherein an opaque layer of chromium metal is deposited on a chromium oxide film previously formed on a substrate.

6. The method of manufacturing a chromium oxide film according to claim 5, wherein the chromium oxide film is formed in an atmosphere consisting of a mixture of 5 to 15% of $CO_2$ gas and 95 to 85% of inert gas and presents a low reflectivity with respect to all light waves.

7. The method of manufacturing a chromium oxide film according to claim 1, wherein the substrate is previously coated with an opaque chromium oxide film, and further an opaque layer of chromium metal is mounted on the chromium oxide film.

8. The method of manufacturing a chromium oxide film according to claim 1, wherein the inert gas is selected from the group consisting of argon, helium and xenon.

9. The method of manufacturing a chromium oxide film according to claim 1, wherein sputtering is applied in reaction between the gaseous atmosphere and chromium metal and also in deposition of the resultant chromium oxide film on a substrate.

10. The method of manufacturing a chromium oxide film according to claim 1, wherein high frequency ion plating is applied in reaction between the gaseous atmosphere and chromium metal and also in deposition of the resultant chromium oxide film on a substrate.

11. A method of manufacturing a photomask comprising the steps of:
   a. scattering particles of chromium metal in an atmosphere selected from the group consisting of a mixture of $CO_2$ gas and inert gas, a mixture of CO gas and inert gas and a mixture of $CO_2$ gas, CO gas and inert gas, the inert gas content being approximately 65 to 95% by volume based on the whole gas mixture;
   b. oxidizing the particles of chromium metal in the atmosphere;
   c. depositing the oxidized chromium metal particles on a substrate to form a film of chromium oxide; and
   d. etching a photoresist pattern on the chromium oxide film.

12. The method of manufacturing a photomask according to claim 11, wherein the atmosphere comprises a mixture of 20% $CO_2$ gas and 80% Ar gas.

* * * * *